(12) United States Patent
Tang et al.

(10) Patent No.: US 9,978,673 B2
(45) Date of Patent: May 22, 2018

(54) PACKAGE STRUCTURE AND METHOD FOR FABRICATING THE SAME

(71) Applicant: Siliconware Precision Industries Co., Ltd., Taichung (TW)

(72) Inventors: Shao-Tzu Tang, Taiwan (TW);
Jia-Fong Yeh, Taiwan (TW);
Chien-Hui Wang, Taiwan (TW);
Chung-Yan Huang, Taiwan (TW);
Ying-Chou Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 1 day.

(21) Appl. No.: 15/397,927

(22) Filed: Jan. 4, 2017

(65) Prior Publication Data
US 2018/0061747 A1  Mar. 1, 2018

(30) Foreign Application Priority Data
Aug. 31, 2016 (TW) .............................. 105128138 A

(51) Int. Cl.
| | |
|---|---|
| *H01L 21/00* | (2006.01) |
| *H01L 23/498* | (2006.01) |
| *H01L 21/56* | (2006.01) |
| *H01L 21/48* | (2006.01) |
| *H01L 23/60* | (2006.01) |
| *H01L 23/00* | (2006.01) |
| *G06K 9/00* | (2006.01) |

(52) U.S. Cl.
CPC .... *H01L 23/49811* (2013.01); *H01L 21/4853* (2013.01); *H01L 21/56* (2013.01); *H01L 23/49805* (2013.01); *H01L 23/562* (2013.01); *H01L 23/60* (2013.01); *G06K 9/0002* (2013.01); *G06K 9/00053* (2013.01)

(58) Field of Classification Search
CPC .................................................. G06K 9/00053
See application file for complete search history.

(56) References Cited

U.S. PATENT DOCUMENTS

| | | | | |
|---|---|---|---|---|
| 2015/0146944 A1* | 5/2015 | Pi | ......................... | H04L 63/0861 382/124 |
| 2015/0243571 A1* | 8/2015 | Tsai | ....................... | H01L 23/041 257/680 |
| 2015/0269407 A1* | 9/2015 | Chou | .................. | G06K 9/00053 382/124 |
| 2017/0076134 A1* | 3/2017 | Lin | ..................... | G06K 9/00053 |
| 2017/0140195 A1* | 5/2017 | Wang | .................. | G06K 9/0002 |
| 2017/0162620 A1* | 6/2017 | Wang | ................ | H01L 27/14618 |

* cited by examiner

*Primary Examiner* — Angel Roman
(74) *Attorney, Agent, or Firm* — Mintz Levin Cohn Ferris Glovsky and Popeo, P.C.; Peter F. Corless; Steven M. Jensen

(57) ABSTRACT

A package structure is provided, including a carrier, an electronic component disposed on the carrier and having a sensing area, an encapsulant formed on the carrier and encapsulating the electronic component and the sensing area, and a conductive layer formed on the encapsulant with the sensing area of the electronic component free from being covered by the conductive layer. The encapsulant prevents a user's finger from being in direct contact with the sensing area so as to protect the sensing area from being damaged and hence ensure normal operation of the electronic component.

26 Claims, 5 Drawing Sheets

FIG. 2C"

PACKAGE STRUCTURE AND METHOD FOR FABRICATING THE SAME

CROSS-REFERENCE TO RELATED APPLICATION

This application claims under 35 U.S.C. § 119(a) the benefit of Taiwanese Patent Application No. 105128138 filed Aug. 31, 2016, the entire contents of which are incorporated herein by reference.

BACKGROUND

1. Technical Field

The present disclosure relates to semiconductor package structures, and, more particularly, to a sensor-type package structure.

2. Description of Related Art

Nowadays, as people are paying more and more attention on privacy protection, many high-end electronic products are equipped with user identification systems to improve data security. Therefore, research and development of identification systems are becoming increasingly important in electronic industries.

Generally, biological identification systems can identify physiological features, such as fingerprints, pupils, faces and voiceprints, or identify behavioral features, such as signatures or voices. Physiological feature identification systems have advantages of uniqueness, high security and convenience, and therefore are widely accepted by consumers.

Further, as high-end electronic products are developed toward the trend of high integration, they are generally equipped with physiological feature identification devices, such as fingerprint identification devices or face identification devices. Currently, fingerprint identification devices are the most widely used devices since such devices facilitate to meet the miniaturization requirement of electronic products. Fingerprint identification devices are divided into optical fingerprint identification devices that can optically scan fingerprint patterns and silicon fingerprint identification devices that can detect faint electrical charges in fingerprint patterns.

FIG. 1 is a schematic cross-sectional view of a conventional package structure 1 of a fingerprint sensor. The package structure 1 has: a substrate 10 having a plurality of conductive pads 101; a sensing chip 11 having a sensing area A and a plurality of electrode pads 110; and an encapsulant 13 encapsulating the sensing chip 11, with the sensing area A of the sensing chip 11 exposed. A user's finger can swipe across the exposed sensing area A for fingerprint identification.

In particular, the sensing chip 11 is disposed on the substrate 10, the electrode pads 110 of the sensing chip 11 are electrically connected to the conductive pads 101 of the substrate 10 through a plurality of bonding wires 111, and the bonding wires 111 are encapsulated by the encapsulant 13.

However, since a user's finger is in direct contact with the sensing area A of the sensing chip 11 made of silicon, the surface of the sensing area A is likely damaged, thus shortening the lifetime of the fingerprint sensor.

Therefore, there is a need to provide a package structure and a fabrication method thereof so as to overcome the above-described drawbacks.

SUMMARY

In view of the above-described drawbacks, the present disclosure provides a package structure, which comprises: a carrier; an electronic component disposed on and electrically connected to the carrier, wherein the electronic component has a sensing area; an encapsulant formed on the carrier and encapsulating the electronic component and the sensing area of the electronic component; and a conductive layer formed on the encapsulant and electrically connected to the carrier, wherein the conductive layer does not cover the sensing area of the electronic component.

The present disclosure further provides a method for fabricating a package structure, which comprises: disposing and electrically connecting an electronic component having a sensing area to a carrier; forming on the carrier an encapsulant encapsulating the electronic component and the sensing area of the electronic component; and forming a conductive layer on the encapsulant, with the sensing area of the electronic component uncovered by the encapsulant, wherein the conductive layer is electrically connected to the carrier.

In an embodiment, the electronic component is electrically connected to the carrier in a flip-chip manner or through wire bonding.

In an embodiment, the electronic component is a fingerprint identification chip.

In an embodiment, a color layer is formed on a surface of the encapsulant.

In an embodiment, a recess is formed on the encapsulant, and the conductive layer is formed in the recess.

In an embodiment, the conductive layer is formed of a filled conductive adhesive, an electroplated metal material or a deposited conductive material.

In an embodiment, the conductive layer is arranged within a projection area of the carrier toward the electronic component.

In an embodiment, the conductive layer is formed at an edge of the encapsulant.

In an embodiment, the conductive layer has a ring shape.

In an embodiment, the conductive layer is flush with or protrudes from an upper surface of the encapsulant.

In an embodiment, a conductive element is further disposed on the carrier and encapsulated by the encapsulant, and the conductive layer is electrically connected to the carrier through the conductive element. In another embodiment, the conductive element is a bonding wire or a bump.

In an embodiment, the conductive layer is in contact with the carrier.

According to the present disclosure, the sensing area of the electronic component is covered by the encapsulant so as to prevent a user's finger from being in direct contact with the sensing area. As such, the present disclosure protects the sensing area from being damaged and ensures normal operation of the electronic component. Further, the conductive layer can effectively conduct electrostatic charges of the finger without increasing the width or thickness of the package structure.

DETAILED DESCRIPTIONS OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

Figure 1:
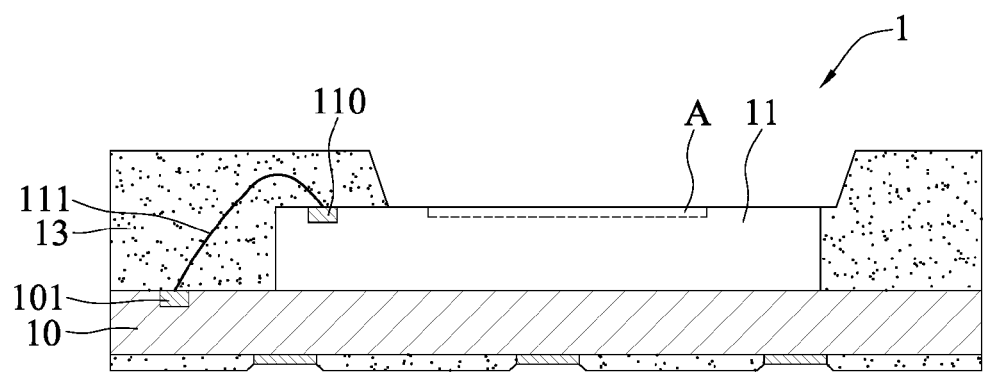
FIG. 1 is a schematic cross-sectional view of a conventional package structure.
Figure 2A:
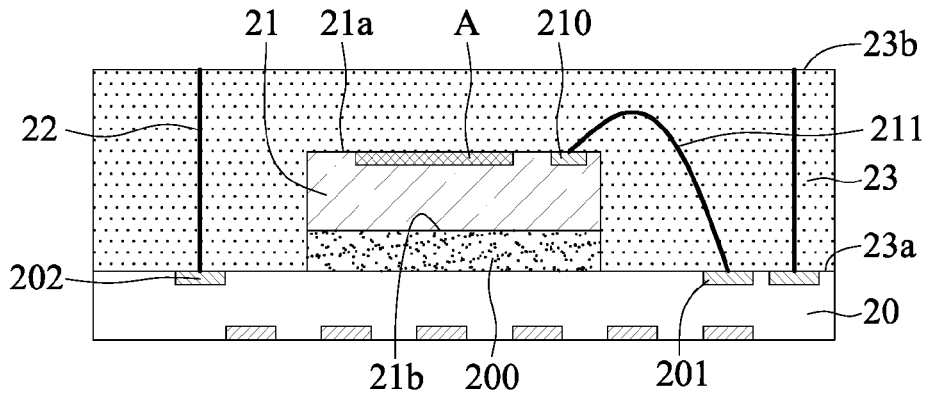
FIGS. 2A to 2C are schematic cross-sectional views showing a method for fabricating a package structure according to a first embodiment of the present disclosure, wherein FIGS. 2C' and 2C" are schematic cross-sectional views taken in another direction of FIG. 2C.
Figure 2B:
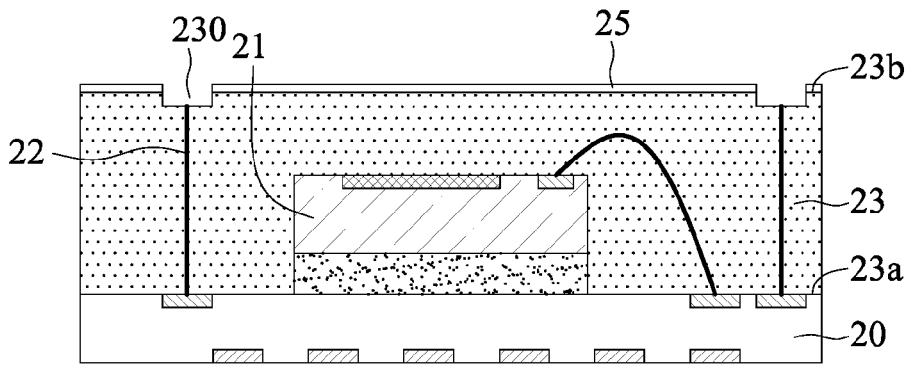
Figure 2C:
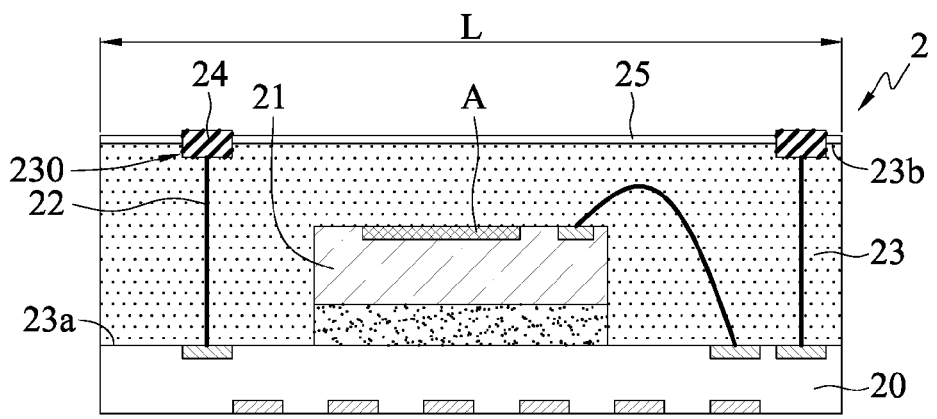
Figure 2C:
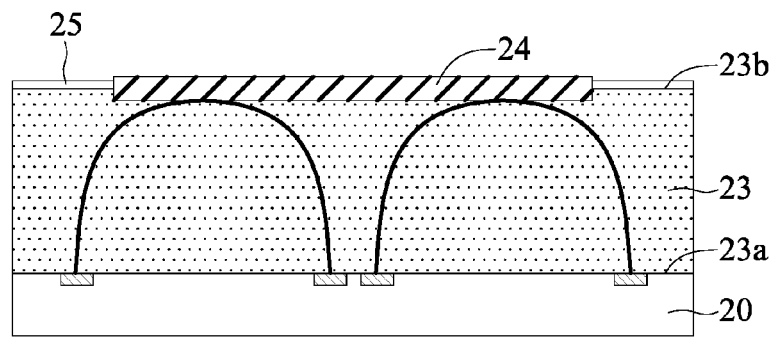

FIGS. 2A to 2C are schematic cross-sectional views showing a method for fabricating a package structure 2 according to a first embodiment of the present disclosure.

Referring to FIG. 2A, an electronic component 21 is disposed on a carrier 20, and at least a conductive element 22 is disposed on the carrier 20. Then, an encapsulant 23 is formed on the carrier 20 and encapsulates the electronic component 21 and the conductive element 22.

In an embodiment, the carrier 20 is a lead frame, a circuit board or a semiconductor board. The electronic component 21 is a sensing chip that is used to detect changes in electrical charges, temperature or pressure of a living organism. Preferably, the electronic component 21 is a fingerprint identification chip that performs a biological identification based on a capacitance difference received from a sensing area. The electronic component 21 has a sensing surface 21a with a sensing area A, and a non-sensing surface 21b opposite to the sensing surface 21a and bonded to the carrier 20 through an adhesive layer 200 such as an epoxy resin film.

The carrier 20 has a plurality of first conductive pads 201 and at least one second conductive pad 202 disposed on an upper side thereof. The sensing surface 21a of the electronic component 21 has a plurality of electrode pads 210. The electrode pads 210 are electrically connected to the first conductive pads 201 through wire bonding (i.e., bonding wires 211). Alternatively, the electronic component 21 is electrically connected to the carrier 20 in a flip-chip manner. That is, the non-sensing surface 21b of the electronic component 21 has electrode pads (not shown) that are bonded and electrically connected to the first conductive pads 201 through a plurality of solder bumps (not shown).

Further, the conductive element 22 is directly bonded to the second conductive pad 202 so as to be electrically connected to the carrier 20. In an embodiment, the conductive element 22 is a bonding wire, and two ends thereof are bonded to two second conductive pads 202 of the carrier 20, respectively. FIG. 2C' shows a profile of the conductive element 22. In an embodiment, the second conductive pads 202 are grounded for subsequently conducting electrostatic charges to a circuit board (not shown) disposed to a lower side of the carrier 20.

Furthermore, the encapsulant 23 is formed by molding on the carrier 20 to encapsulate the electronic component 21, the sensing area A, the conductive element 22 and the bonding wires 211. The encapsulant 23 has a first surface 23a bonded to the carrier 20 and a second surface 23b opposite to the first surface 23a.

Referring to FIG. 2B, at least one recess 230 is formed on the second surface 23b of the encapsulant 23 to expose the conductive element 22.

In an embodiment, the recess 230 is formed at an edge of the second surface 23b of the encapsulant 23 and has, for example, a ring shape.

Further, before formation of the recess 230, a color layer 25 is coated on the outer surface of the encapsulant 23. The color layer 25 can be made of ink, for example. The color layer 25 is, for example, white, red or gold, to match the appearance of an electronic device (for example, a mobile phone) to which the package structure 2 is to be applied.

Referring to FIG. 2C, a conductive layer 24 is formed in the recess 230 and electrically connected to the carrier 20. The conductive layer 24 does not cover the sensing area A. Further, the conductive layer 24 is arranged within a projection area L of the carrier 20 toward the electronic component 21.

In an embodiment, the conductive layer 24 is electrically connected to the carrier 20 through the conductive element 22. In another embodiment, the conductive layer 24 is in contact with the conductive element 22. In an embodiment, the conductive layer 24 is in contact with the arced top portion of the conductive element 22, as shown in FIG. 2C'. Alternatively, referring to FIG. 2C", the encapsulant 23 is partially removed from the second surface 23b thereof along with the arced top portion of the conductive element 22. As such, the conductive element 22 is split into two separate segments 220, and the conductive layer 24 is in contact with end portions of the segments 220.

Further, a conductive adhesive such as silver paste can be filled in the recess 230, heated and cured to serve as the conductive layer 24. Alternatively, the conductive layer 24 can be formed of an electroplated metal material or a deposited conductive material.

Figure 2D:
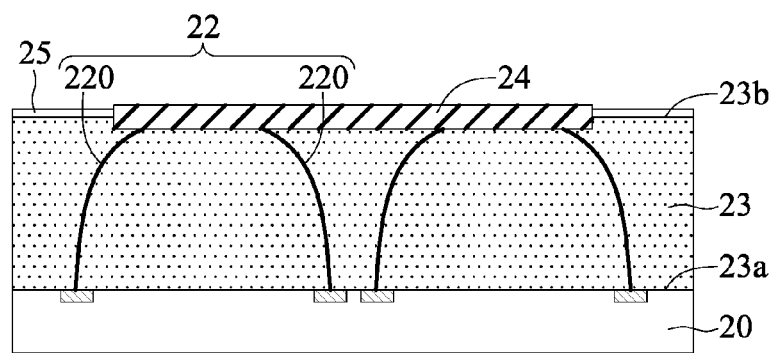
FIG. 2D is a schematic upper view of FIG. 2C.
Figure 2D:
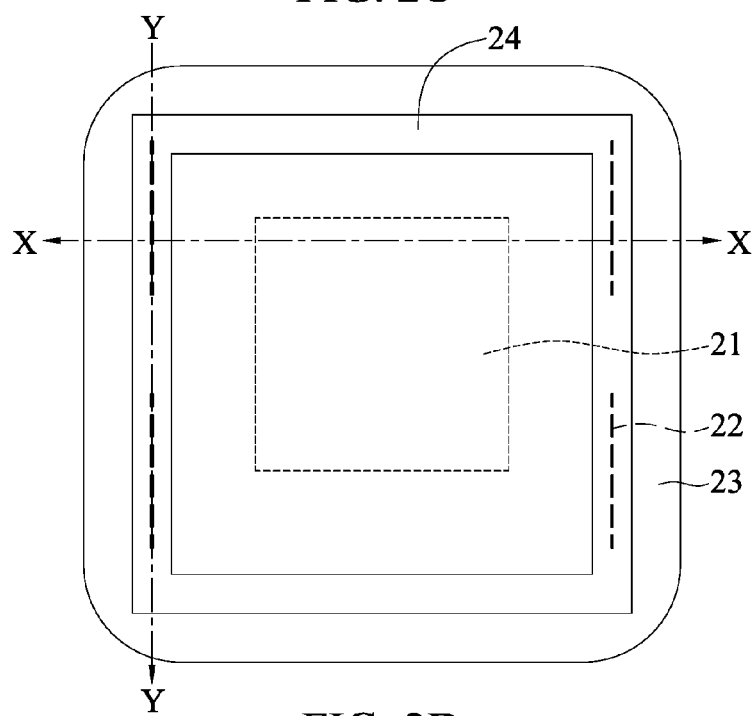

Furthermore, the conductive layer 24 protrudes from the second surface 23b of the encapsulant 23. Referring to FIG. 2D, the conductive layer 24 is formed at an edge of the second surface 23b of the encapsulant 23 and has, for example, a ring shape. Since the ring-shaped conductive layer 24 is electrically connected to the carrier 20, when the fingerprint sensor is pressed by a user's finger, the conductive layer 24 can conduct electrostatic charges of the finger.

FIG. 2C shows a schematic cross-sectional view taken along an X-X sectional line of FIG. 2D, and FIG. 2C' or 2C" shows a schematic cross-sectional view taken along a Y-Y sectional line of FIG. 2D.

Figure 3A:
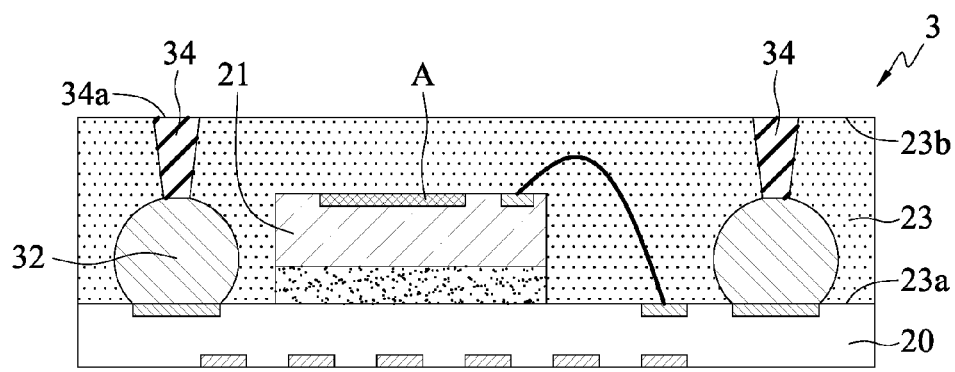
FIGS. 3A and 3B are schematic cross-sectional views of package structures according to a second embodiment of the present disclosure, wherein FIG. 3B' is a schematic upper view of FIG. 3B.
Figure 3B:
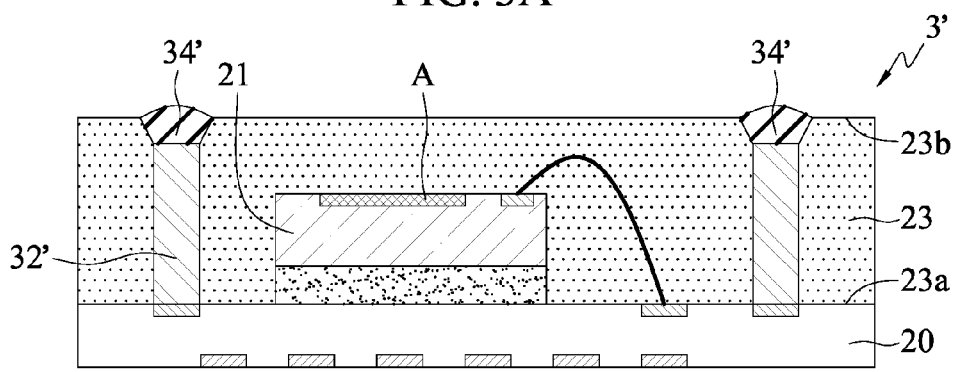
Figure 3B:
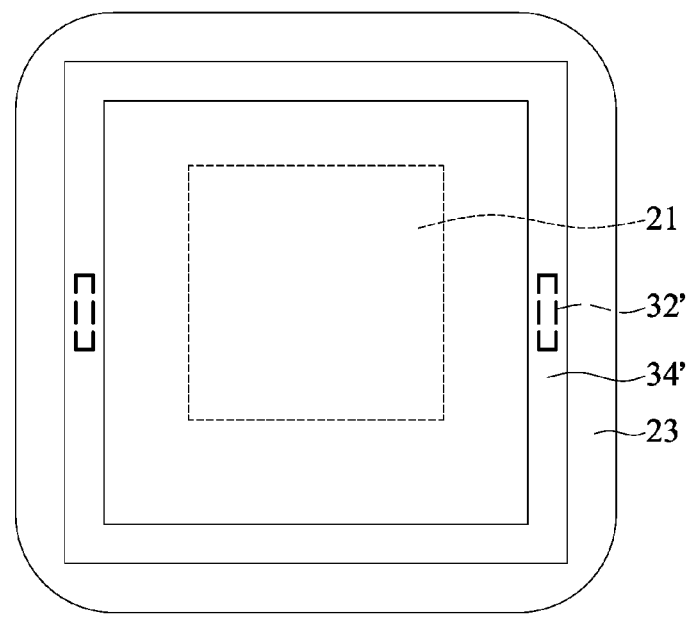

FIGS. 3A and 3B are schematic cross-sectional views showing package structures 3, 3' according to a second embodiment of the present disclosure. The second embodiment and the first embodiment employ different processes to fabricate the conductive element.

Referring to FIG. 3A, the conductive element 32 is a bump made of a solder material such as a solder ball. Alternatively, the conductive element 32 can be a copper ball.

In an embodiment, an upper surface 34a of the conductive layer 34 is flush with the second surface 23b of the encapsulant 23.

Further, referring to FIGS. 3B and 3B', the conductive element 32' is a metal post or frame such as a copper post or frame, and the conductive layer 34' protrudes from the second surface 23b of the encapsulant 23.

Figure 4A:
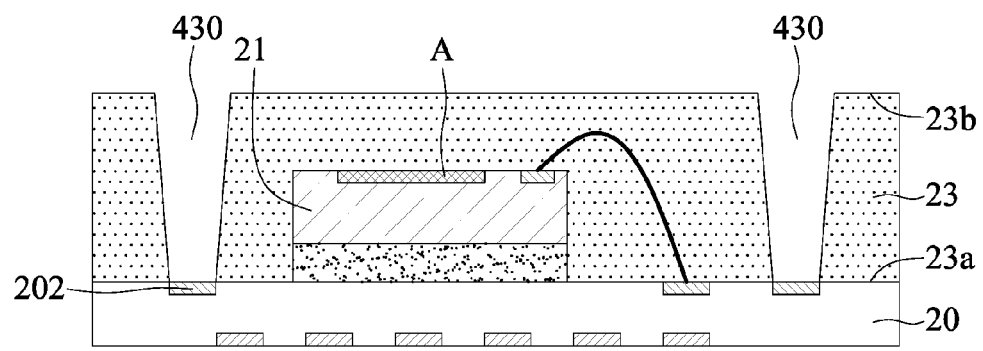
FIGS. 4A and 4B are schematic cross-sectional views showing a method for fabricating a package structure according to a third embodiment of the present disclosure, wherein FIG. 4B' is a schematic upper view of FIG. 4B.
Figure 4B:
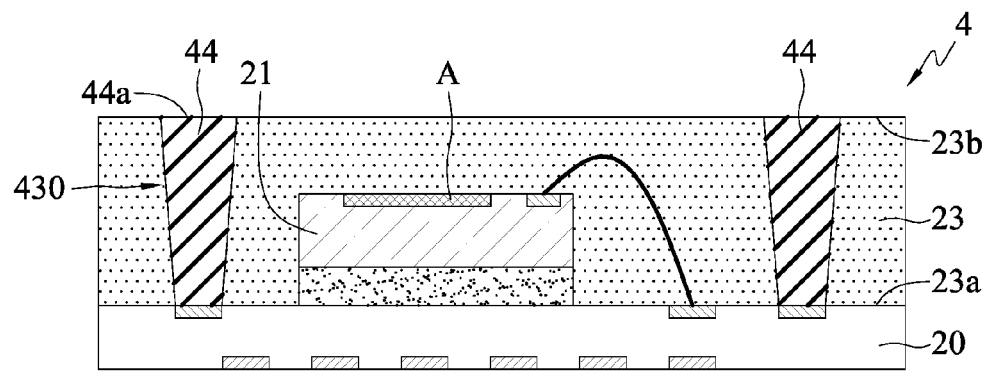
Figure 4B:
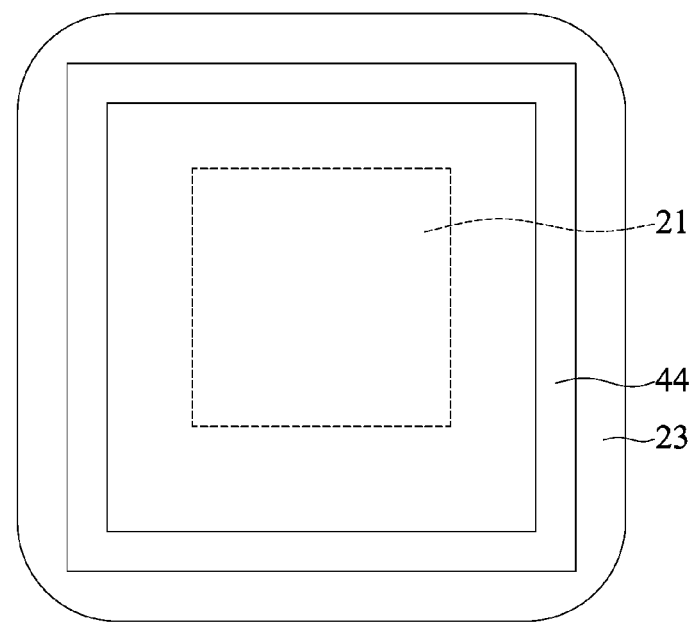

FIGS. 4A and 4B are schematic cross-sectional views showing a method for fabricating a package structure 4 according to a third embodiment of the present disclosure. The third embodiment omits some processes of the first embodiment.

Referring to FIG. 4A, at least one recess 430 is formed on the second surface 23b of the encapsulant 23 and communicates with the first surface 23a of the encapsulant 23 to expose the second conductive pad 202.

Referring to FIG. 4B, a conductive layer 44 is formed in the recess 430 and in contact with the carrier 20 and the second conductive pad 202 so as to be electrically connected to the carrier 20.

In an embodiment, the conductive layer 44 has a wall shape, a post shape or a sheet shape.

Further, an upper surface 44a of the conductive layer 44 is flush with the second surface 23b of the encapsulant 23.

During operation of a fingerprint sensor having the package structure 2, 3, 3', 4, when a user's finger touches the second surface 23b of the encapsulant 23, a capacitance difference is received and scanned by the sensing area A so as to be used by the electronic component 21 for fingerprint identification.

According to the present disclosure, the sensing area A of the electronic component 21 is covered by the encapsulant 23 so as to prevent the user's finger from being in direct contact with the sensing area A. As such, the present disclosure protects the sensing area A from being damaged, ensures normal operation of the electronic component 21, and prolongs the lifetime of the package structure 2, 3, 3', 4.

Further, since arranged within the projection area L of the carrier 20 toward the electronic component 21 and electrically connected to the carrier 20, the ring-shaped conductive layer 24, 34, 34', 44 of the package structure 2, 3, 3', 4 can effectively conduct electrostatic charges of the finger without increasing the width or thickness of the package structure 2, 3, 3', 4.

Furthermore, the conductive layer 24, 34, 34', 44 can protrude from or be flush with the second surface 23b of the encapsulant 23. Therefore, the thickness of the package structure 2, 2, 2', 4 can be changed according to the practical need so as to meet the miniaturization requirement. In an embodiment, the conductive layer is not lower than the second surface 23b of the encapsulant 23. If the conductive layer is lower than the second surface 23b of the encapsulant 23, it will become difficult for a user's finger to touch the conductive layer. Consequently, electrostatic charges of the finger cannot be conducted away.

In addition, the conductive element 22, 32, 32' and the conductive layer 24, 34, 34', 44 can be fabricated by conventional equipment, thus reducing the fabrication cost.

The present disclosure further provides a package structure 2, 3, 3', 4, which has: a carrier 20; an electronic component 21 disposed on and electrically connected to the carrier 20, wherein the electronic component 21 has a sensing area A; an encapsulant 23 formed on the carrier 20 and encapsulating the electronic component 21 and the sensing area A of the electronic component 21; and a conductive layer 24, 34, 34', 44 formed on the encapsulant 23 and electrically connected to the carrier 20, wherein the conductive layer 24, 34, 34', 44 does not cover the sensing area A of the electronic component 21.

In an embodiment, the electronic component 21 a fingerprint identification chip.

In an embodiment, a color layer 25 is formed on a surface of the encapsulant 23.

In an embodiment, a recess 230, 430 is formed on the encapsulant 23, and the conductive layer 24, 34, 34', 44 is formed in the recess 230, 430.

In an embodiment, the conductive layer 24, 34, 34', 44 is made of a conductive adhesive or a metal material.

In an embodiment, the conductive layer 24, 34, 34', 44 is arranged within a projection area of the carrier 20 toward the electronic component 21.

In an embodiment, the electronic component 21 is electrically connected to the carrier 20 in a flip-chip manner or through wire bonding.

In an embodiment, the conductive layer 24, 34, 34', 44 is formed at an edge of the encapsulant 23. In an embodiment, the conductive layer 24, 34, 34', 44 has a ring shape.

In an embodiment, the conductive layer 24, 34' protrudes from the encapsulant 23.

In an embodiment, the conductive layer 34, 44 is flush with a second surface 23b of the encapsulant 23.

In an embodiment, at least one conductive element 22, 32, 32' is further disposed on the carrier 20 and encapsulated by the encapsulant 23, and the conductive layer 24, 34, 34' is electrically connected to the carrier 20 through the conductive element 22, 32, 32'. In an embodiment, the conductive element 22, 32, 32' is a bonding wire or a bump.

In an embodiment, the conductive layer 44 is in contact with the carrier 20.

According to the present disclosure, the sensing area of the electronic component is covered by the encapsulant so as to prevent a user's finger from being in direct contact with the sensing area. As such, the present disclosure protects the sensing area from being damaged, ensures normal operation of the electronic component and prolongs the lifetime of the package structure.

Further, the conductive layer can effectively conduct electrostatic charges of the finger without increasing the width or thickness of the package structure.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A package structure, comprising:
   a carrier;
   an electronic component disposed on and electrically connected to the carrier, wherein the electronic component has a sensing area;
   an encapsulant formed on the carrier and encapsulating the electronic component and the sensing area of the electronic component; and
   a conductive layer formed on the encapsulant and electrically connected to the carrier with the sensing area of the electronic component free from being covered by the conductive layer, wherein the conductive layer is free from being electrically connected to the electronic component.

2. The package structure of claim 1, wherein the electronic component is a fingerprint identification chip.

3. The package structure of claim 1, further comprising a color layer formed on a surface of the encapsulant.

4. The package structure of claim 1, further comprising a recess formed on the encapsulant with the conductive layer formed in the recess.

5. The package structure of claim 1, wherein the conductive layer is formed of a filled conductive adhesive, an electroplated metal material or a deposited conductive material.

6. The package structure of claim 1, wherein the conductive layer is made of a conductive adhesive or a metal material.

7. The package structure of claim 1, wherein the conductive layer is arranged within a projection area of the carrier toward the electronic component.

8. The package structure of claim 1, wherein the conductive layer is formed at an edge of the encapsulant.

9. The package structure of claim 1, wherein the conductive layer has a ring shape.

10. The package structure of claim 1, wherein the conductive layer is flush with or protrudes from an upper surface of the encapsulant.

11. The package structure of claim 1, further comprising a conductive element formed on the carrier and encapsulated by the encapsulant with the conductive layer being electrically connected to the carrier through the conductive element.

12. The package structure of claim 11, wherein the conductive element is a bonding wire or a bump.

13. The package structure of claim 1, wherein the conductive layer is in contact with the carrier.

14. A method for fabricating a package structure, comprising:
   disposing and electrically connecting an electronic component having a sensing area to a carrier;
   forming on the carrier an encapsulant encapsulating the electronic component and the sensing area of the electronic component; and
   forming on the encapsulant a conductive layer electrically connected to the carrier with the sensing area of the electronic component free from being covered by the conductive layer, wherein the conductive layer is free from being electrically connected to the electronic component.

15. The method of claim 14, wherein the electronic component is electrically connected to the carrier in a flip-chip manner or through wire bonding.

16. The method of claim 14, wherein the electronic component is a fingerprint identification chip.

17. The method of claim 14, further comprising forming a color layer on a surface of the encapsulant.

18. The method of claim 14, further comprising forming a recess on the encapsulant with the conductive layer formed in the recess.

19. The method of claim 14, wherein the conductive layer is formed of a filled conductive adhesive, an electroplated metal material or a deposited conductive material.

20. The method of claim 14, wherein the conductive layer is arranged within a projection area of the carrier toward the electronic component.

21. The method of claim 14, wherein the conductive layer is formed at an edge of the encapsulant.

22. The method of claim 14, wherein the conductive layer has a ring shape.

23. The method of claim 14, wherein the conductive layer is flush with or protrudes from an upper surface of the encapsulant.

24. The method of claim 14, further comprising forming on the carrier a conductive element electrically connecting the conductive layer to the carrier with the conductive element being encapsulated by the encapsulant.

25. The method of claim 24, wherein the conductive element is a bonding wire or a bump.

26. The method of claim 14, wherein the conductive layer is in contact with the carrier.

* * * * *